United States Patent

Botti et al.

[11] Patent Number: 5,654,668
[45] Date of Patent: Aug. 5, 1997

[54] HIGH EFFICIENCY BRIDGE AMPLIFIER

[75] Inventors: Edoardo Botti, Vigevano; Tiziana Mandrini, Casorate Primo, both of Italy

[73] Assignee: SGS-Thomson Microelectronics, S.r.l., Agrate Brianza, Italy

[21] Appl. No.: 540,401

[22] Filed: Oct. 6, 1995

[30] Foreign Application Priority Data

Oct. 7, 1994 [EP] European Pat. Off. ............. 94830478

[51] Int. Cl.$^6$ ...................................................... H03F 1/14
[52] U.S. Cl. ................................................ 330/51; 330/146
[58] Field of Search ............................. 330/51, 146, 149, 330/258, 301

[56] References Cited

U.S. PATENT DOCUMENTS

| 4,494,077 | 1/1985 | Fukaya et al. | 330/295 |
| 4,983,927 | 1/1991 | Torazzina | 330/51 |
| 5,194,821 | 3/1993 | Brambilla et al. | 330/51 |
| 5,365,188 | 11/1994 | Botti et al. | 330/51 |
| 5,444,417 | 8/1995 | Botti et al. | 330/51 |

FOREIGN PATENT DOCUMENTS

| 0487133 | 9/1992 | European Pat. Off. . |
| 0613242 | 8/1994 | European Pat. Off. . |
| 2527904 | 1/1977 | Germany . |

*Primary Examiner*—Steven Mottola
*Attorney, Agent, or Firm*—Allen, Dyer, Doppelt, Milbrath & Gilchrist, P.A.

[57] ABSTRACT

Distorting effects and disturbances caused by abrupt voltage changes on the output nodes of a pair of selfconfiguring amplifiers for alternatively driving in a bridge mode or in a single-ended mode by one amplifier of the pair a certain load, in dependence on the level of the input signal, because of the enabling/disabling of a common mode control loop, are effectively eliminated by storing the voltage of a common mode control node of the pair of amplifiers on a capacitance during a phase of disabling of said common mode control loop. Abrupt voltage drops and recoveries at the switching instants are prevented.

12 Claims, 4 Drawing Sheets

HIGH EFFICIENCY BRIDGE AMPLIFIER

BACKGROUND AND SUMMARY OF THE INVENTION

The present invention relates to a self-configuring amplifier wherein voltage spikes on the outputs arising from the switching from a single-ended configuration to a bridge configuration and vice versa of a pair of amplifying stages are effectively depressed.

In many applications and primarily in audio reproduction systems, for example in car radios and similar apparatuses that are intrinsically compact because of stringent installation requirements, as well as in portable apparatuses, power dissipation in final amplifying stages, often quadruple in order to drive a pair of loudspeakers (front and rear) for each stereo channel, may create problems of heat balance. For example, four 20 W amplifiers may have a power dissipation of about 4×12=48 W and because of the limited space available in certain apparatuses, such a power may be difficult to be dissipated without an increased internal temperature of the apparatus. On the other hand, a relatively high temperature of operation may damage the magnetic tape of cassettes or optical disks (CD), the drives of which are often tightly fitted inside a single apparatus case.

The absence of a double (or symmetrical) supply in many of these apparatuses does not allow the use of highly efficient configurations in terms of power dissipation, as for example a so-called class-G configuration.

With the aim of overcoming these limitations or, notwithstanding these limits, reducing somewhat power dissipation for the same audio power output, particular self-configuring techniques of several integrated amplifiers have been developed for optimizing power dissipation by modifying their configuration in function of the signal level.

Systems of this type are described in the U.S. Pat. Nos. 5,365,188 and 5,444,417 in the name of the same applicant, both of which are hereby incorporated by reference.

As mentioned at the end of the description of the self-configurable double bridge amplifier in these patents, during operation phases in which an amplifier of each pair of amplifiers is configured so as to function as a single-ended amplifier for driving its own load in series with the load of the other amplifier of the other pair, the common mode control loop of each pair of configurable bridge amplifiers is automatically deactivated, according to well known techniques.

An example of a common mode control loop that can be activated during a phase of bridge configuration of the amplifiers is described and illustrated in prior U.S. patent application Ser. No. 793,628.

In FIGS. 4 and 5 of said prior patent application is shown a typical common mode control loop constituted by a voltage divider R6–R7 and a differential amplifier TR suitable to force the maintenance of a constant voltage on a common output node C of the pair of amplifiers A1 and A2. The common mode control loop is activated or deactivated by the configuring switch F. In practice the loop is deactivated when the second amplifier A2 is deactivated and the amplifier A1 drives the load L in a single-ended mode.

A self-configuring, double bridge amplifier, similar to the one described in the prior U.S. Pat. Nos. 5,365,188 and 5,444,417, is depicted in FIG. 1.

The respective common mode control loops of each of the two pairs of amplifiers are also shown in the circuit diagram of FIG. 1. Functionally, each common mode control loop comprises a resistive voltage divider RC1–RC2 (RC3–RC4), a common mode differential amplifier Gm1 (Gm2) and a configuring switch SW_CL1 (SW_CL2), according to a known technique.

It has been observed that such a common mode control system produces some important drawbacks.

When the system functions with the configuring switches SW_F open and SW_C closed, that is when the double bridge amplifier is configured for a relatively low output power (low level of the input signal) by the configuring window comparator, the common mode feedback amplifiers Gm1 and Gm2 are practically deactivated by their respective configuring switches SW_CL1 and SW_CL2 which short-circuit the input terminals of the respective feedback amplifier.

When, upon the rise of the input signal level, the configuring window comparator commands the configuring switches to implement a double bridge structure, that is with SW_F closed and SW_C open, the relative switches SW_CL1 and SW_CL2 switch to ground potential. As a consequence, each common mode amplifier, for example Gm1, acts on the respective pair of operational amplifiers OPA+F and OPA–F which compose a single bridge driving a respective load (loudspeaker), so as to bring the voltage (Vc1) of the common node of the resistances RC1 and RC2 to ground potential. In the waveforms shown in FIG. 3a, it may be observed that these transitions of the inverting input of the common mode feedback amplifier cause abrupt voltage variations on the outputs of the amplifiers (instants labelled A, B, C and D in the diagrams) when the node Vc1 switches from a certain potential assumed before the switching to ground potential.

Similar abrupt variations of the voltage would occur also in the case where a disabling switch of the common mode control loop is used at the output of the common mode feedback amplifiers (Gm1, Gm2) instead of using a switch for short-circuiting its inputs as in the scheme shown in FIGS. 4 and 5 of the prior U.S. patent application Ser. No. 793,628.

These abrupt voltage changes, occurring at every transition from a configuration to the other, cause distortions that are hardly recovered by the feedback system of the amplifier because they encompass a range of high frequency harmonics, where the gain of the feedback loop of the amplifier and therefore the reduction of distortion is relatively modest. Another negative effect of these abrupt voltage changes is represented by the consequent electromagnetic disturbance (emi) they may generate.

These problems and limitations of the known systems are overcome by the present invention. It has been found that the disturbances caused by switching enabling and disabling a common mode control loop of a pair of self-configuring amplifiers may be substantially eliminated. This is achieved by implementing a different method of enabling/disabling the common mode control loop. According to the invention, enabling/disabling of the common mode control loop is effected by employing a configuring switch and a storage capacitance for retaining a common mode voltage information during the period in which the configuring switch remains open. Substantially this maintains the voltage of the common mode control node at the same value it had at the last switching instant.

In this way, large and abrupt voltage transitions are prevented in the output signals of the configurable amplifiers.

The elimination of the problems connected with the abrupt voltage variations provoked by the configuring switchings, that is by the alternating enabling/disabling of the common mode control loop, is achieved with a negligible increase of the complexity of the circuit of the system of self-configuring amplifiers as a whole, because the storage capacitances may be very small and therefore easily integratable.

BRIEF DESCRIPTION OF THE DRAWING

The different aspects and advantages of the invention will become more evident through the following description of several important embodiments and by referring to the annexed drawings, wherein.

DETAILED DESCRIPTION OF THE PREFERRED EMBODIMENTS

Figure 1:
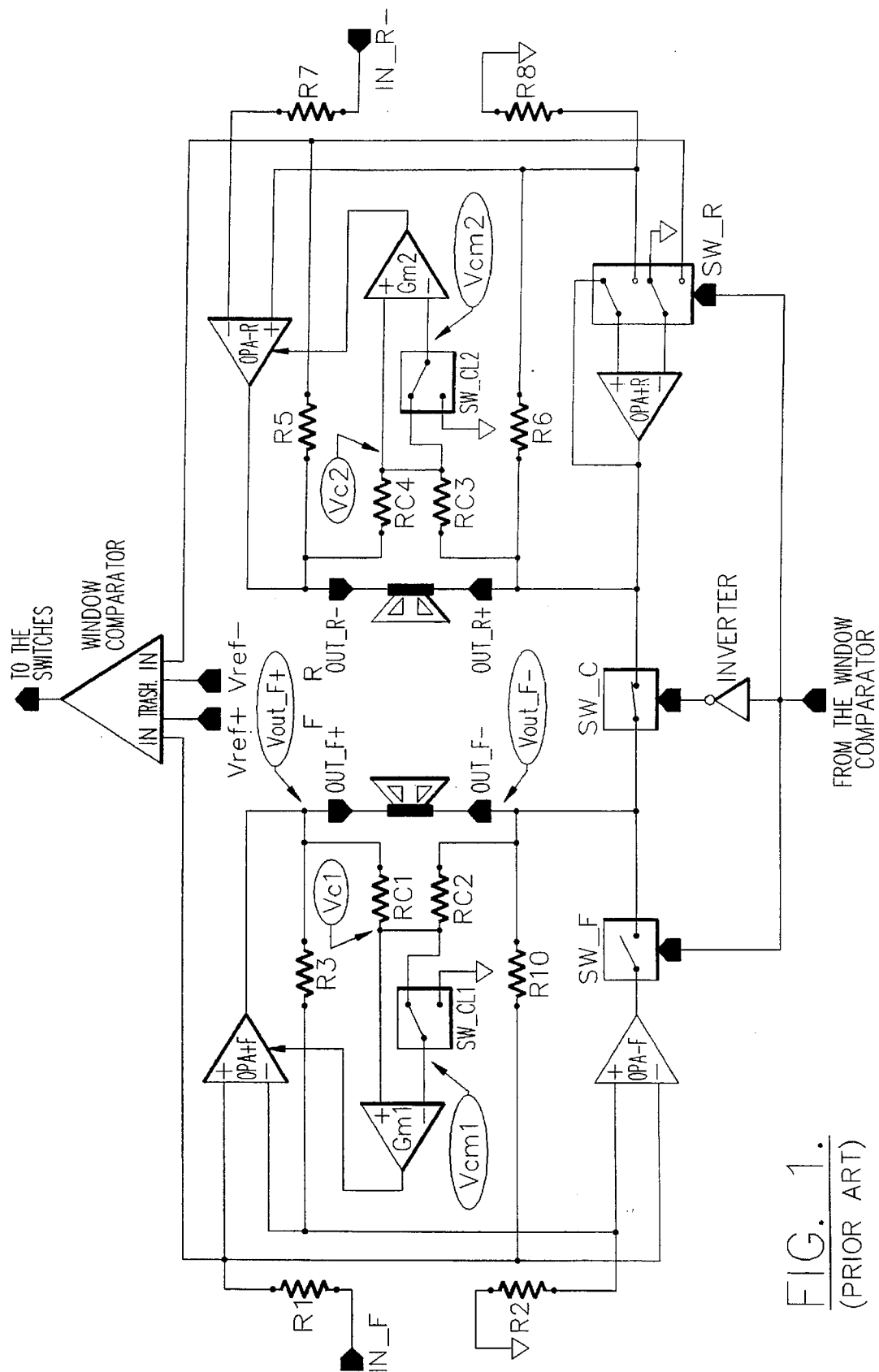
FIG. 1 shows a functional circuit of a double bridge amplifier of the prior art provided with respective common mode control loops according to a known technique, as already described above.
Figure 2:
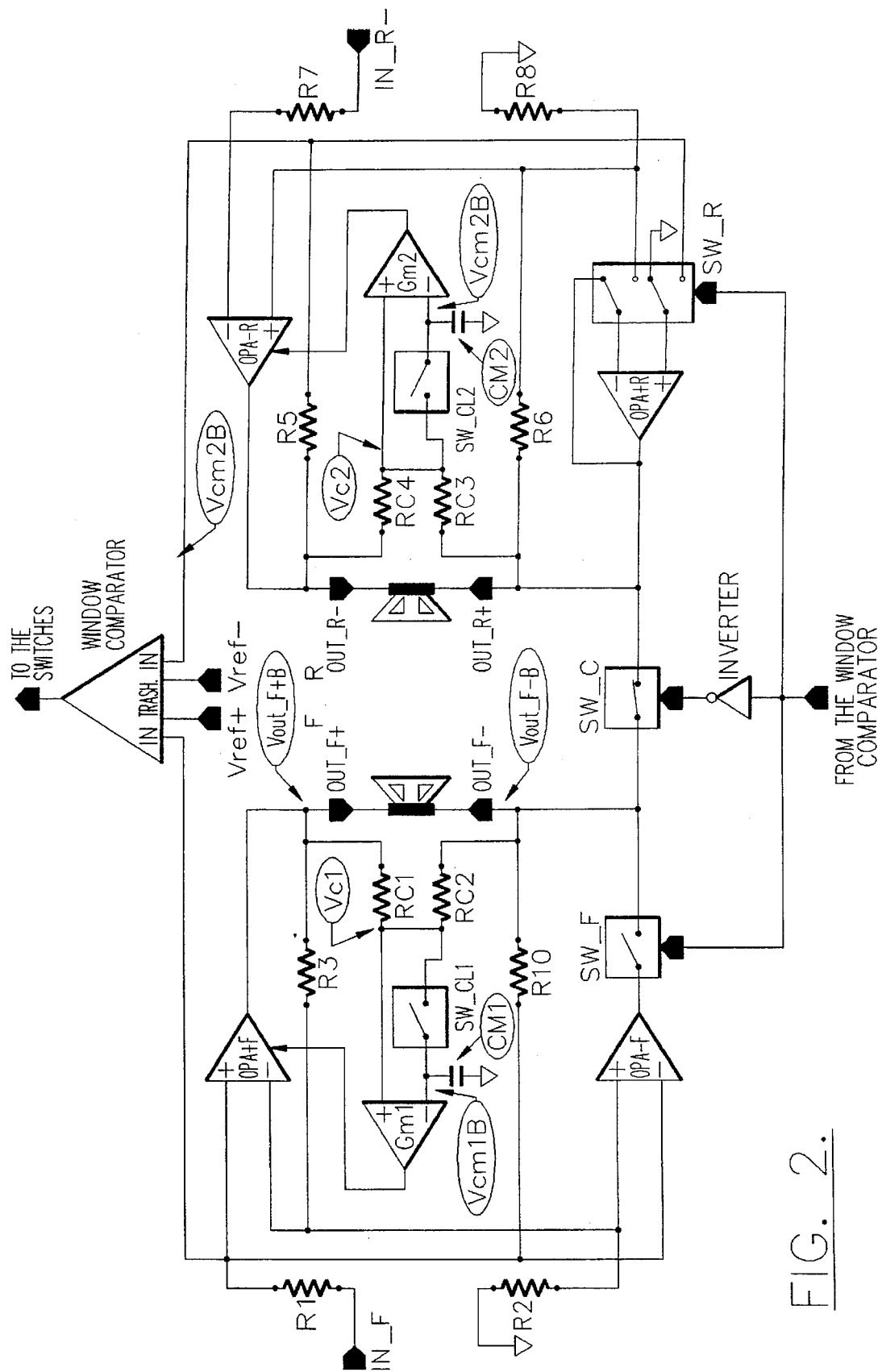
FIG. 2 shows a functional circuit similar to the one depicted in FIG. 1, made according to the present invention for suppressing disturbances due to the configuring switchings.

The illustrative circuit diagrams of FIGS. 1 and 2 show a self-configuring, double bridge amplifier, for example for a stereo channel of an audio reproduction installation, of the type described in U.S. Pat. Nos. 5,365,188 and 5,444,417.

Figure 3B:
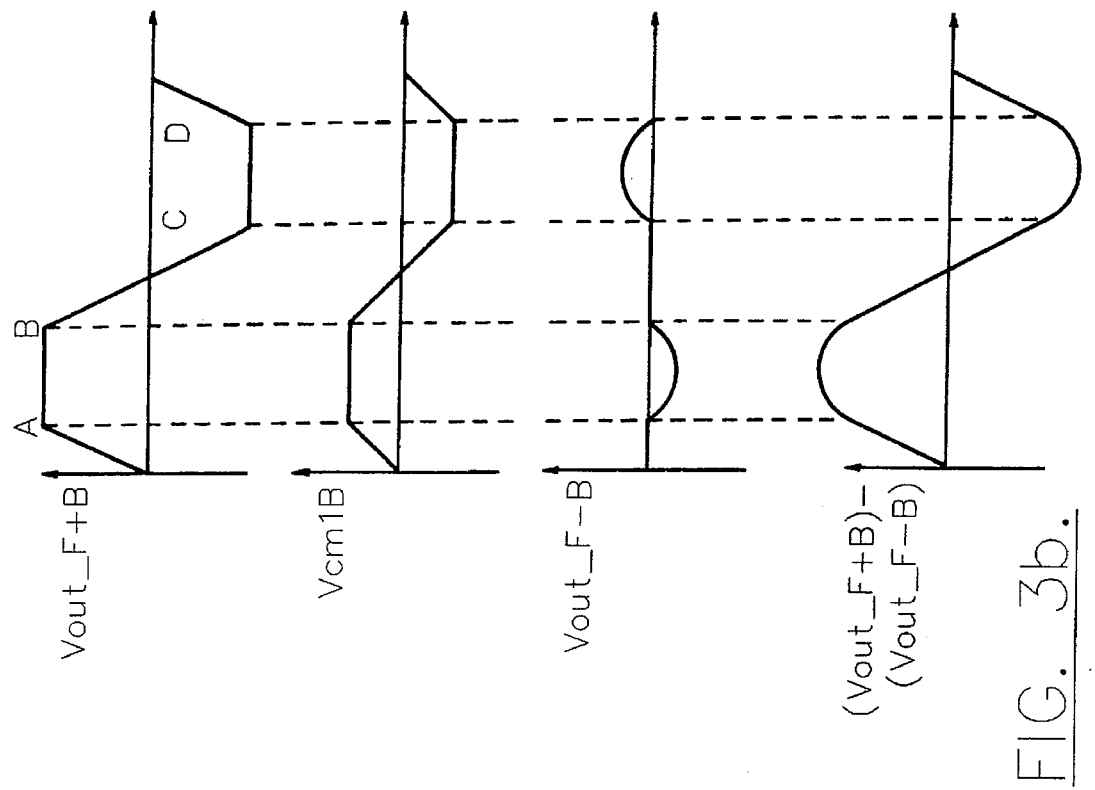
FIGS. 3a and 3b show comparable respective waveforms as produced in a prior art circuit of FIG. 1 and in a circuit according to the present invention of FIG. 2.
Figure 3A:
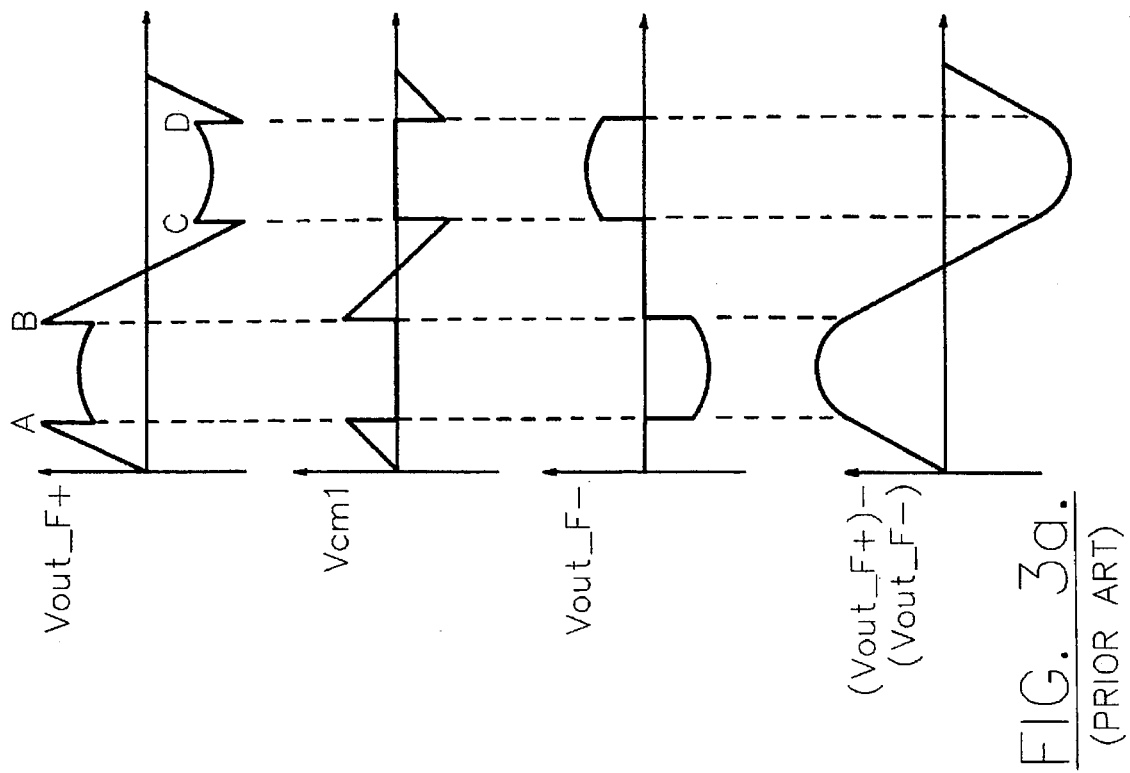

As already said, when each pair of amplifiers is bridge configured pursuant to the opening of the switches SW__C and the closing of the switches SW__F, the respective common mode control loops of each pair of amplifiers are enabled by switching to ground potential the relative configuring switches SW__CL1 and SW__CL2. The waveform of the outputs Vout__F+ and Vout__F−, of the common output node Vc1 and of the inverting input of the relative common mode feedback amplifier Gm1 are shown in FIG. 3a. As may be observed, at the switching instants (A, B, C and D) from one mode of operation to the other, that is at the enabling and disabling instants of the respective common mode control loop, abrupt variations are produced in the output voltage, which may cause hardly compensable distortions as well as the emission of electromagnetic disturbances.

According to the method of the invention, these abrupt voltage changes may be avoided by modifying the manner in which the self-configuring system operates (enables and disables the relative common mode control loop) and precisely by storing the actual voltage of the common mode control node (Vc1), assumed during a phase in which the common mode control loop is deactivated, that is when the two inputs of the common mode feedback amplifier (Gm1) are short-circuited, on a storage capacitor connected between the inverting input of the feedback amplifier at ground. In this way, the opening and closing of the input short-circuiting switch will not generate any abrupt voltage change at these input nodes.

The system of the invention may be implemented as depicted in FIG. 2 by introducing a storage capacitor CM1 (CM2) that may be connected (as shown in the example of FIG. 2) between the inverting input of the common mode feedback differential amplifier Gm1 (Gm2) and ground, and by employing a simple configuring switch SW__CL1 (SW__CL2) for short-circuiting the inverting input with the non-inverting input of the common mode feedback amplifier when the self-configuring system commands a bridge configuration of the pair of amplifiers OPA+F and OPA−F (OPA−R and OPA+R). Of course, the storing capacitor CM1 (CM2) and obviously also the relative configuring switch SW__CL1 (SW__CL2) may be connected alternatively to the other (non-inverting) input of the common mode feedback differential amplifier Gm1 (Gm2). Also in this case, the capacitor stores the common output node Vc1 (Vc2) during a closing phase of the configuring switch.

By referring to any pair of bridge configurable amplifiers, for example to the pair composed of OPA+F and OPA−F, during a phase in which the switch SW__CL1 is closed, thus short-circuiting the inputs of the common mode feedback amplifier Gm1, the storage capacitor Cm1 charges to the voltage of the common mode control node Vc1, which corresponds to the intermediate node of the resistive voltage divider composed of the resistances RC1 and RC2 of the common mode control network. The storage capacitor Cm1 retains this voltage information for the whole period during which the configuring switch SW__CL 1 remains open and therefore acts on the common mode control loop so as to maintain the potential of the common mode control node Vc1 at the same value it had at the switching instant. As may be observed from the series of waveforms of FIG. 3b, the system of the invention eliminates any abrupt changes of the output voltages in correspondence of the switching instants A, B, C and D.

The device of the invention can be easily realized because the value of the storage capacitance Cm1 may be very small and therefore can be easily integrated.

Of course, the considerations made for the common mode control loop of one of the two self-configuring pairs of amplifiers are valid also for a similar common mode control loop of the other pair of amplifiers that composes the self-configuring, double bridge amplifier shown in the figures.

Figure 4:
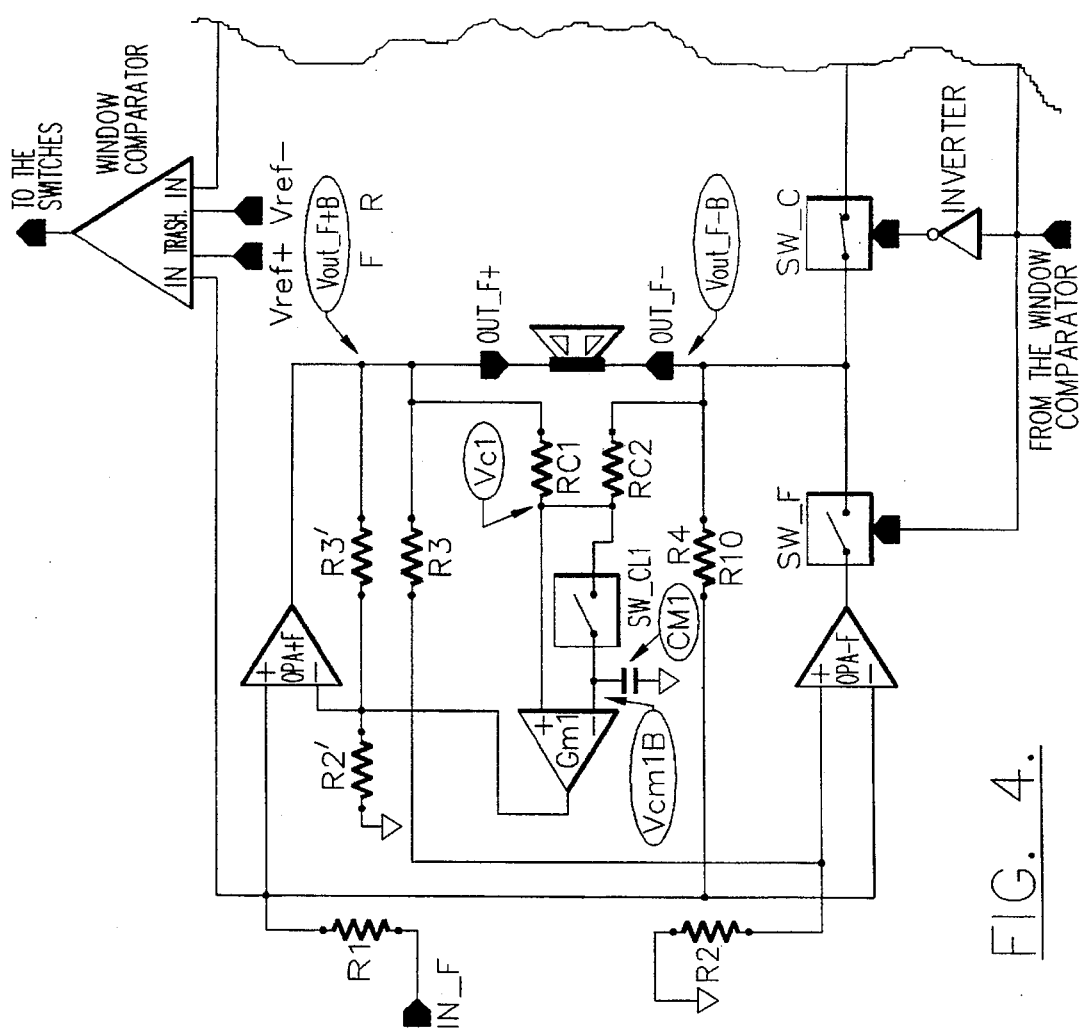
FIG. 4 shows the coupling of the output of a common mode control loop more in detail.

The coupling of the output of the common mode feedback differential amplifier to the respective configurable amplifier of the pair of amplifiers may be implemented in various ways. A particularly effective embodiment is shown in the partial circuit of FIG. 4. In practice, the resistances, R2 and R3 respectively, of the feedback loop of the operational amplifier OPA+F of one pair of amplifiers, which can be configured to function in a single ended mode of the functional diagram of FIG. 2, may be subdivided by employing pairs of resistances R2-R2' and R3-R3', as shown in FIG. 4. The common node of the resistances R2' and R3', which is connected to the inverting input of the OPA+F operational amplifier, is also connected to the output of the common mode feedback amplifier Gm1.

Figure 5:
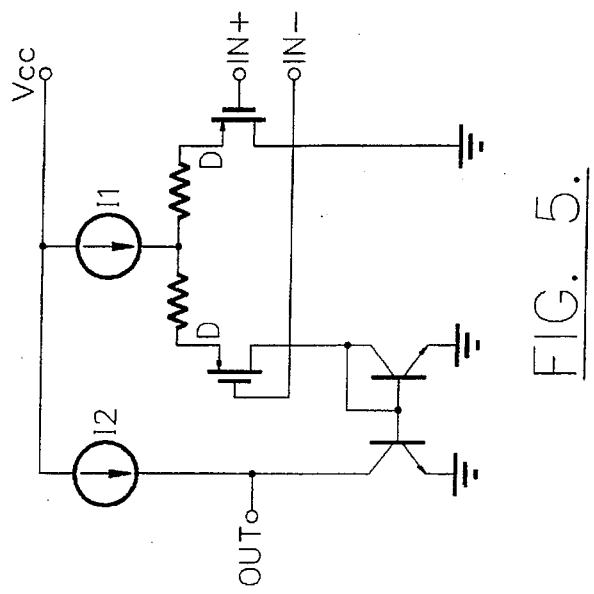
FIG. 5 shows the circuit diagram of a common mode feedback amplifier usable in a self-configuring amplifier of the present invention.

In case of an integrated implementation of the amplifier, the ability of retaining the voltage information of the storage capacitor Cm1, which must necessarily require a small area of integration and therefore has a relatively small capacitance, may be enhanced by minimizing the input currents of the common mode feedback amplifier Gm1. To this end, field effect input transistors (MOSFET) are preferably used. A suitable common mode differential feedback amplifier circuit is schematically shown in FIG. 5.

According to a disclosed class of innovative embodiments, there is provided: A common mode control circuit for a pair of amplifiers which conditionally self-configure, in dependence on the level of an input signal, both into a bridge configuration for driving a first load and also into a single-ended mode of operation of one of said amplifiers for driving said first load, comprising: at least one common mode differential feedback amplifier having a non-inverting input connected to a common mode control node of said pair of amplifiers and an inverting input that is switched by a configuring means, wherein said configuring means comprises a configuring switch connected to selectably short-circuit said inverting input to said noninverting input; and a storage capacitor connected between one of said two inputs and a common voltage node of the circuit of said amplifiers.

According to another disclosed class of innovative embodiments, there is provided: A method for preventing abrupt voltage changes at the outputs of a pair of amplifiers Which conditionally self-configure, in dependence on the level of an input signal, both into a bridge configuration for driving a first load and also into a single-ended mode of operation of one of said amplifiers for driving said first load, in a circuit which includes at least one common mode feedback amplifier having a non-inverting input functionally connected to a common mode control node of said pair of amplifiers and an inverting input that is switched by configuring means, comprising the steps of: during a first phase of configuration when said inputs are short-circuited by a configuring switch, storing the voltage of said output node of said pair of amplifiers on a capacitor connected between an input of said common mode differential amplifier and a common potential node of the circuit of the amplifiers; and during a second phase of configuration when said short-circuiting switch is open, exploiting the voltage information stored in said capacitor for keeping constant the voltage on said common mode control node.

According to another disclosed class of innovative embodiments, there is provided: A dual bridge amplifier comprising first through fourth operational amplifiers, connectable both in a first configuration comprising a single bridge amplifier including said first amplifier and said second amplifier driving a load comprised of a first load and a second load connected in series, and also in a second configuration comprising a first bridge amplifier and a second bridge amplifier wherein said first bridge amplifier includes said first operational amplifier and said third operational amplifier and said second bridge amplifier includes said second operational amplifier and fourth operational amplifier, respectively, each driving one of said first and second loads; and a window comparator connected to generate a configuration signal, in dependence on the instantaneous value of input signals that are fed respectively to a first input terminal and a second input terminal of the dual bridge amplifier; said configuration signal being connected to control configuring means which connect said amplifiers in said first or second configurations; and wherein a capacitor is connected across said configuring means, to dampen transients when said configuring means changes the configuration of said amplifiers.

According to another disclosed class of innovative embodiments, there is provided: A method of reducing power dissipation in a double bridge amplifier comprising the steps of: generating a configuring signal in response to a plurality of instantaneous values of signals fed to the amplifier; driving by said generated signal a plurality of configuring means that configure the amplifier as a single bridge amplifier that drives a plurality of loads when the instantaneous value of the input signals are within a window defined reference voltages, and as two distinct bridge amplifiers, each driving one of the loads of the plurality of loads, when the instantaneous value of at least one of the input signals is outside the window defined by said reference voltages; and suppressing transient signals, when said configuring means change the configuration of said amplifier, using a capacitor connected to said configuring means.

According to another disclosed class of innovative embodiments, there is provided: A self-configurable amplifier for driving a first load and a second load comprising: a plurality of means for amplifying a signal, each means for amplifying a signal being capable of driving a load; means for connecting one of a load, a means for amplifying, a voltage source and a ground to one of another load, another means for amplifying, the voltage source, and the ground; means for controlling the means for connecting to create selectively a first configuration wherein the first load and the second load are connected in series by the means for connecting, and two means for amplifying drive the loads, and a second configuration wherein the first load is driven by two means for amplifying and the second load is driven by two other means for amplifying; and a capacitor connected across said connecting means to dampen transients.

According to another disclosed class of innovative embodiments, there is provided: A method for reducing power dissipation in a double bridge amplifier, in which a first load is driven by a first operational amplifier and a third operational amplifier and a second load is driven by a second operational amplifier and a fourth operational amplifier, comprising the steps of: receiving two input signals by a controller; determining if either input signal is within a predetermined voltage threshold; sending an output signal from the controller to a plurality of switches, and selectively configuring the double bridge amplifier as a single bridge amplifier, wherein the first load is in series with the second load, by selectively opening and closing each switch; and suppressing transients when said output signal changes, by using a capacitor which is connected across at least one said switch.

According to another disclosed class of innovative embodiments, there is provided: A self-configurable amplifier for driving a first load and a second load comprising: a plurality of operational amplifiers; a plurality of connector elements between one of a load, an operational amplifier, a voltage source and a ground to one of another load, another operational amplifier, the voltage source and the ground; and a controller for operating the connector elements to create selectively a first configuration wherein the first load and the second load are connected in series by the connector elements, and two operational amplifiers drive the loads, and a second configuration wherein the first load is driven by two operational amplifiers and the second load is driven by two other operational amplifiers.

According to another disclosed class of innovative embodiments, there is provided: A self-configurable amplifier for reducing power dissipation while driving first and second loads with first and second signals respectively, comprising: a first terminal that receives the first signal; a second terminal that receives the second signal; an amplifying circuit, coupled to the first and second terminals and the first and second loads, that drives the first load and the second load with the first signal and the second signal, respectively; means, coupled to the first and second loads, for disconnecting the first and second loads from each other when at least one of the first and second signals are outside a voltage window defined by a first reference voltage and a second reference voltage, and connecting the first and second loads in series when the first and second signals are both within the voltage window so that power dissipation is reduced; and a capacitor connected across said means to suppress transients when said means performs disconnections and connections.

Modifications and Variations

As will be recognized by those skilled in the art, the innovative concepts described in the present application can be modified andvaried over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. A common mode control circuit for a pair of amplifiers which conditionally self-configure, in dependence on the level of an input signal, both into a bridge configuration for driving a first load and also into a single-ended mode of operation of one of said amplifiers for driving said first load, comprising:
    at least one common mode differential feedback amplifier having a non-inverting input connected to a common mode control node of the pair of amplifiers and an inverting input; and
    configuring means connected to the inverting input of said at least one common mode differential amplifier and comprising
        a configuring switch for selectably short-circuiting the inverting input to the inverting input to the non-inverting input, and
        a storage capacitor, connected between one of the inverting and non-inverting inputs and the common mode control node of the pair of amplifiers, for being charged to a charged voltage responsive to the inverting and non-inverting inputs being short-circuited and for retaining the charged voltage for a period of time from a switching instant and while the configuring switch is open to maintain the common mode control node at a same voltage as at the switching instant and thereby reduce voltage transients which would otherwise occur in output signals of the pair of amplifiers.

2. A common mode control circuit as defined in claim 1 wherein said at least one common mode differential feedback amplifier comprises a pair of field effect input transistors.

3. A common mode control circuit as defined in claim 1, wherein said storage capacitor is connected to the inverting input of said at least one common mode differential feedback amplifier.

4. A common mode control circuit as defined in claim 1, wherein the pair of amplifiers is configured in a single-ended operation mode to drive in a bridge mode said first load in series with a second load of a second pair of self-configuring amplifiers, in dependence on the level of at least one of the input signals.

5. A method for reducing abrupt voltage changes at the outputs of a pair of amplifiers which conditionally self-configure, in dependence on the level of an input signal, both into a bridge configuration for driving a first load and also into a single-ended mode of operation of one of the amplifiers for driving the first load, in a circuit which includes at least are common mode differential feedback amplifier having a non-inverting input functionally connected to a common mode control node of the pair of amplifiers and an inverting input, the method comprising the steps of:

during a first phase of configuration when said inputs are short-circuited by a configuring switch, charging a storage capacitor, connected between one of the inverting and non-inverting inputs and the common mode control node of the pair of amplifiers, to a charged voltage; and during a second phase of configuration when said short-circuiting switch is open, retaining the charged voltage on said capacitor for a period of time from a switching instant and while the configuring switch is open to maintain the common mode control node at a same voltage as at the switching instant and thereby reduce voltage transients which would otherwise occur in output signals of the pair of amplifiers.

6. A self-configurable dual bridge amplifier comprising:
    first through fourth operational amplifiers, connectable both in
    a first configuration comprising a single bridge amplifier including said first amplifier and said second amplifier driving a load comprised of a first load and a second load connected in series, and also in
    a second configuration comprising a first bridge amplifier and a second bridge amplifier wherein said first bridge amplifier includes said first operational amplifier and said third operational amplifier and said second bridge amplifier includes said second operational amplifier and fourth operational amplifier, respectively, each driving one of said first and second loads;
    at least one common mode differential feedback amplifier having a non-inverting input connected to a common mode control node of a pair of amplifiers and an inverting input; and
    configuring means connected to the inverting input of said at least one common mode differential amplifier and comprising
        a configuring switch for selectably short-circuiting the inverting input to the non-inverting input, and
        a storage capacitor, connected between one of the inverting and non-inverting inputs and the common mode control node of the pair of amplifiers, for being charged to a charged voltage responsive to the inverting and non-inverting inputs being short-circuited and for retaining the charged voltage for a period of time from a switching instant and while the configuring switch is open to maintain the common mode control node at a same voltage as at the switching instant and thereby reduce voltage transients which would otherwise occur in output signals of the pair of amplifiers.

7. A self-configurable amplifier according to claim 6, wherein said configuring means further comprises a window comparator and a plurality of electronic switches.

8. A self-configurable amplifier as defined in claim 7, wherein said window comparator generates said configuring signal driving a two pole switch capable of commuting the inputs of said fourth operational amplifier, a first power switch capable of isolating the output of said third operational amplifier and, through an inverter, a second power switch capable of connecting in series said two loads.

9. A self-configurable amplifier as defined in claim 8, wherein said two-pole switch commutes the inputs of said fourth amplifier from a connection to a respective input terminal of the amplifier and to a differential feedback line, functional to a configuration of the amplifier as one of two distinct bridge amplifiers, to a connection to ground and to a buffer feedback line, and a single bridge amplifier configuration.

10. A self-configurable amplifier according to claim 7, wherein said electronic switches functionally implement a first two-pole switch capable of commuting the inputs of said fourth amplifier, a second two-pole switch capable of commuting the inputs of said third amplifier and a single-pole power switch capable of connecting in series said first load and said second load.

11. A self-configurable amplifier as defined in claim 10, wherein said second two-pole switch commutes the inputs of said third amplifier from a connection to a respective input terminal of the amplifier and to a differential feedback line, functional to one of a configuration as two distinct bridge amplifiers, to a connection to a first and to a second buffer feedback lines, respectively connected across a series resistance connected to the output node of the amplifier, and a single bridge amplifier configuration.

12. A self-configurable amplifier as defined in claim 6, wherein each of said four operational amplifiers has a differential feedback line.

* * * * *